(12) United States Patent
Katsunuma et al.

(10) Patent No.: US 9,087,676 B2
(45) Date of Patent: Jul. 21, 2015

(54) PLASMA PROCESSING METHOD AND PLASMA PROCESSING APPARATUS

(71) Applicant: Tokyo Electron Limited, Tokyo (JP)

(72) Inventors: Takayuki Katsunuma, Miyagi (JP); Masanobu Honda, Miyagi (JP); Hironobu Ichikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/154,385

(22) Filed: Jan. 14, 2014

(65) Prior Publication Data
US 2014/0197135 A1    Jul. 17, 2014

Related U.S. Application Data

(60) Provisional application No. 61/758,323, filed on Jan. 30, 2013.

(30) Foreign Application Priority Data

Jan. 15, 2013  (JP) ................................ 2013-004698

(51) Int. Cl.
*C03C 15/00* (2006.01)
*H01J 37/32* (2006.01)

(52) U.S. Cl.
CPC ..... *H01J 37/32091* (2013.01); *H01J 37/32477* (2013.01)

(58) Field of Classification Search
CPC ....................... H01J 37/32091; H01J 37/32477
USPC .......... 216/37, 67; 438/689–692; 156/345.24, 156/345.33
See application file for complete search history.

(56) References Cited

U.S. PATENT DOCUMENTS

| 6,379,575 B1 * | 4/2002 | Yin et al. ........................ 216/67 |
| 7,316,785 B2 | 1/2008 | Adams et al. |
| 2012/0091095 A1 * | 4/2012 | Wang et al. ..................... 216/37 |

* cited by examiner

*Primary Examiner* — Duy Deo
*Assistant Examiner* — Maki Angadi
(74) *Attorney, Agent, or Firm* — Pearne & Gordon LLP (57) ABSTRACT

A plasma processing method includes forming a silicon oxide film on a surface of a member provided within a chamber with plasma of a silicon-containing gas without oxygen while controlling a temperature of the member to be lower than a temperature of another member; performing a plasma process on a target object loaded into the chamber with plasma of a processing gas after the silicon oxide film is formed on the surface of the member; and removing the silicon oxide film from the surface of the member with plasma of a fluorine-containing gas after the target object on which the plasma process is performed is unloaded to an outside of the chamber.

7 Claims, 6 Drawing Sheets

| LOWER PART TEMPERATURE | 20DEG.C | 40DEG.C | 60DEG.C |
|---|---|---|---|
| CROSS SECTION | | | |
| SILICON OXIDE FILM THICKNESS | 108nm | 103nm | 101nm |

FIG. 5

| LOWER PART TEMPERATURE | 20DEG.C | 40DEG.C | 60DEG.C |
|---|---|---|---|
| CROSS SECTION | | | |
| SILICON OXIDE FILM THICKNESS | 89nm | 30nm | 0(UNMEASURABLE) |

FIG. 6

| UPPER PART TEMPERATURE | 40 DEG.C | 60 DEG.C | 80 DEG.C |
|---|---|---|---|
| CROSS SECTION | | | |
| SILICON OXIDE FILM THICKNESS | 105nm | 105nm | 108nm |

FIG. 7

| UPPER PART TEMPERATURE | 40 DEG.C | 60 DEG.C | 80 DEG.C |
|---|---|---|---|
| CROSS SECTION | | | |
| SILICON OXIDE FILM THICKNESS | UNMEASURABLE | 53nm | 89nm |

PLASMA PROCESSING METHOD AND PLASMA PROCESSING APPARATUS

CROSS-REFERENCE TO RELATED APPLICATION

This application claims the benefit of Japanese Patent Application No. 2013-004698 filed on Jan. 15, 2013, and U.S. Provisional Application Ser. No. 61/758,323 filed on Jan. 30, 2013, the entire disclosures of which are incorporated herein by reference.

TECHNICAL FIELD

The embodiments described herein pertain generally to a plasma processing method and a plasma processing apparatus.

BACKGROUND

In a semiconductor manufacturing process, there has been widely used a plasma processing apparatus configured to perform a plasma process for thin film deposition or etching. Examples of the plasma processing apparatus may include a plasma CVD (Chemical Vapor Deposition) apparatus configured to deposit a thin film, or a plasma etching apparatus configured to perform an etching process.

However, in the plasma processing apparatus, a member provided in a chamber (hereinafter, appropriately referred to as "in-chamber member") is exposed to plasma of a processing gas during various plasma processes, and thus needs to have plasma resistance. In this regard, Patent Document 1 describes that before performing a plasma process on a target object, a silicon oxide film is formed as a protective film on a surface of the in-chamber member with plasma of a silicon-containing gas with oxygen, so that plasma resistance of the in-chamber member is increased.

Patent Document 1: Specification of U.S. Patent Laid-open Publication No. 2012/0091095

However, in the conventional technology of forming a silicon oxide film with a silicon-containing gas with oxygen, it is not considered to improve controllability of a film thickness depending on a temperature of a member.

That is, according to the conventional technology, silicon oxide is produced by reacting oxygen radicals with Si radicals in plasma of the silicon-containing gas with oxygen within a space of a chamber, and the produced silicon oxide is deposited as a silicon oxide film on the in-chamber member. A film thickness of the silicon oxide deposited as the silicon oxide film on the in-chamber member is uniform regardless of a temperature of the in-chamber member. For this reason, in the conventional technology, it is difficult to control a thickness of the film on the in-chamber member depending on a temperature of the in-chamber member.

SUMMARY

In accordance with example embodiments, a plasma processing method includes a film forming process, a plasma process and a removal process. In the film forming process, a silicon oxide film is formed on a surface of a member provided within a chamber with plasma of a silicon-containing gas without oxygen while controlling a temperature of the member to be lower than a temperature of another member. Further, in the plasma process, a plasma process is performed on a target object loaded into the chamber with plasma of a processing gas after the silicon oxide film is formed on the surface of the member. Furthermore, in the removal process, the silicon oxide film is removed from the surface of the member with plasma of a fluorine-containing gas after the target object on which the plasma process is performed is unloaded to an outside of the chamber.

In one example embodiment, a plasma processing method includes forming a silicon oxide film on a surface of a member provided within a chamber with plasma of a silicon-containing gas without oxygen while controlling a temperature of the member to be lower than a temperature of another member; performing a plasma process on a target object loaded into the chamber with plasma of a processing gas after the silicon oxide film is formed on the surface of the member; and removing the silicon oxide film from the surface of the member with plasma of a fluorine-containing gas after the target object on which the plasma process is performed is unloaded to an outside of the chamber.

The member may include an inner wall of the chamber and a lower electrode provided within the chamber, and the another member may include an upper electrode provided within the chamber to face the lower electrode. Further, in the forming of the silicon oxide film, the silicon oxide film may be formed on surfaces of the inner wall of the chamber and the lower electrode while controlling temperatures of the inner wall of the chamber and the lower electrode to be lower than a temperature of the upper electrode.

In the forming of the silicon oxide film, a bias voltage may be applied.

The silicon-containing gas may include at least one of $SiCl_4$ and $SiF_4$.

The fluorine-containing gas may include at least one of $NF_3$, $SF_6$, and $CF_4$.

The silicon-containing gas may further include a rare gas.

The rare gas may be Ar or He.

In another example embodiment, a plasma processing apparatus includes a chamber in which a plasma process is performed on a target object; an exhaust unit configured to depressurize an inside of the chamber; a gas supply unit configured to supply a processing gas into the inside of the chamber; and a control unit. The control unit is configured to form a silicon oxide film on a surface of a member provided within the chamber with plasma of a silicon-containing gas without oxygen while controlling a temperature of the member within the chamber to be lower than a temperature of another member; perform a plasma process on the target object loaded into the chamber with plasma of the processing gas after the silicon oxide film is formed on the surface of the member; and remove the silicon oxide film from the surface of the member with plasma of a fluorine-containing gas after the target object on which the plasma process is performed is unloaded to an outside of the chamber.

In accordance with various aspects and example embodiments, a plasma processing method and a plasma processing apparatus can improve controllability of a film thickness depending on a temperature of a member. The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 1:
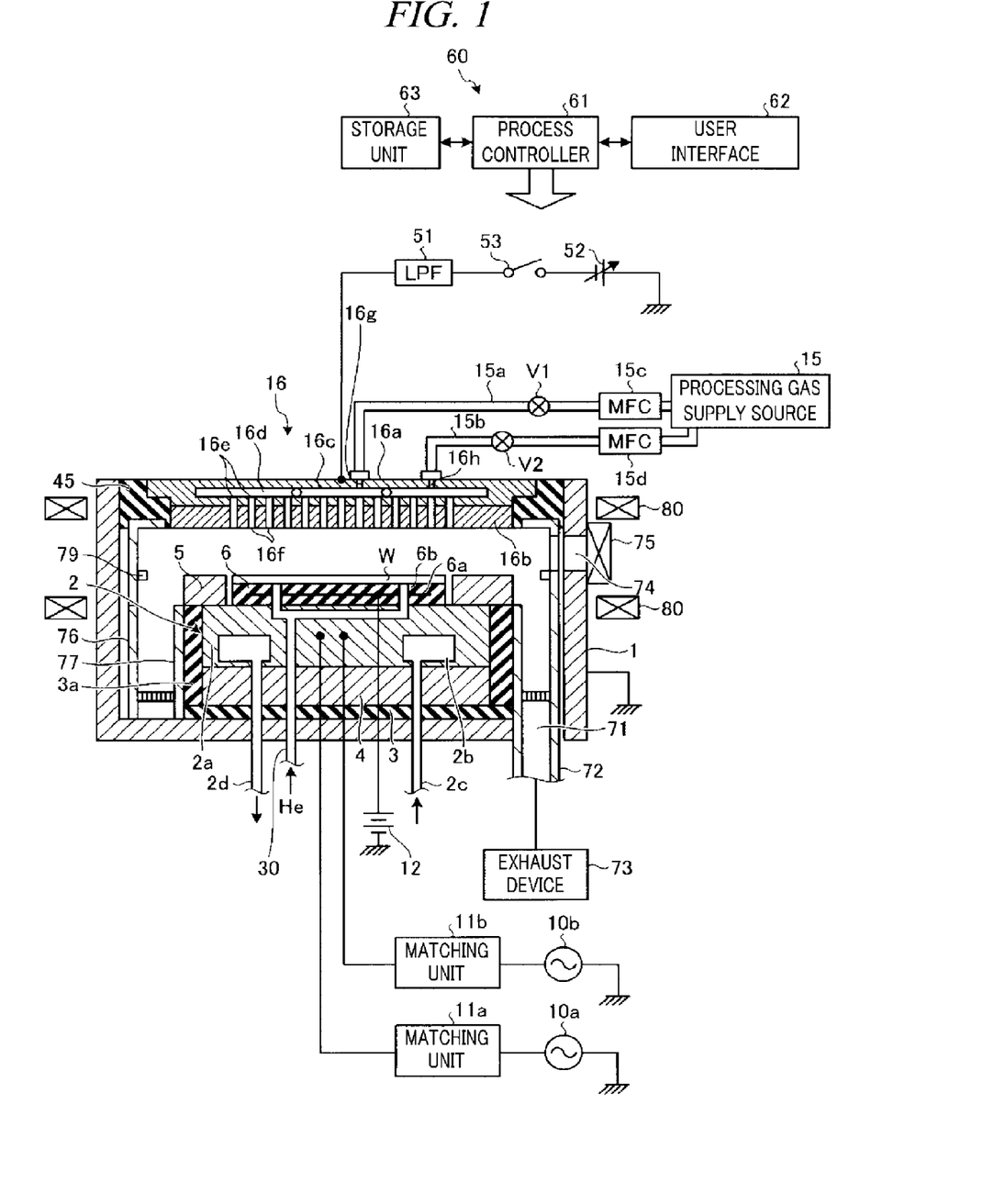
FIG. 1 is a schematic cross-sectional view of a plasma processing apparatus in which a plasma processing method in accordance with a present example embodiment is performed.

FIG. 1 is a schematic cross-sectional view of a plasma processing apparatus in which a plasma processing method in accordance with the present example embodiment is performed. The plasma processing apparatus depicted in FIG. 1 includes a processing chamber 1 that is airtightly provided and electrically grounded. The processing chamber 1 has a cylindrical shape and is made of, for example, aluminum on which an anodic oxidized film is formed. Within the processing chamber 1, there is provided a mounting table 2 configured to horizontally mount thereon a semiconductor wafer W serving as a target object.

The mounting table 2 includes a base member 2a made of a conductive metal such as aluminum and serves as a lower electrode. The mounting table 2 is supported by a conductive supporting member 4 on an insulating plate 3. Further, a focus ring 5 formed of, for example, single-crystalline silicon is provided on an upper outer periphery of the mounting table 2. Furthermore, an inner wall member 3a having a cylindrical shape and formed of, for example, quartz, is provided to surround the mounting table 2 and the supporting member 4.

A shower head 16 serving as an upper electrode is provided above the mounting table 2 to face the mounting table 2 in parallel with the mounting table 2, i.e. to face the semiconductor wafer W supported on the mounting table 2. The shower head 16 and the mounting table 2 are configured to serve as a pair of electrodes (upper electrode and lower electrode). The base member 2a of the mounting table 2 is connected to a first high frequency power supply 10a via a first matching unit 11a. Further, the base member 2a of the mounting table 2 is also connected to a second high frequency power supply 10b via a second matching unit 11b. The first high frequency power supply 10a is configured to supply a high frequency power for plasma generation and apply the high frequency power of a preset frequency (for example, 100 MHz) to the base member 2a of the mounting table 2. Further, the second high frequency power supply 10b is configured to supply a high frequency power for ion attraction (for a bias) and apply the high frequency power of a preset frequency (for example, 13 MHz) lower than that of the first high frequency power supply 10a to the base member 2a of the mounting table 2.

An electrostatic chuck 6 configured to electrostatically attract and hold the semiconductor wafer W is provided on a top surface of the mounting table 2. In the electrostatic chuck 6, an electrode 6a is inserted into an insulator 6b, and the electrode 6a is connected to a DC power supply 12. Further, when a DC voltage is applied from the DC power supply 12 to the electrode 6a, the semiconductor wafer W is attracted and held by a Coulomb force.

A coolant path 2b is formed within the mounting table 2, and the coolant path 2b is connected to a coolant inlet line 2c and a coolant outlet line 2d. The supporting member 4 and the mounting table 2 can be controlled to have a preset temperature by circulating a coolant such as galden or the like through the coolant path 2b. Further, a backside gas supply line 30 configured to supply a gas (backside gas) for heat transfer such as a helium gas or the like to a rear surface of the semiconductor wafer W is provided to pass through the mounting table 2 or the like. The backside gas supply line 30 is connected to a non-illustrated backside gas supply source. With this configuration, the semiconductor wafer W attracted and held by the electrostatic chuck 6 on the top surface of the mounting table 2 can be controlled to have a preset temperature.

The shower head 16 is provided on a top wall of the processing chamber 1. The shower head 16 includes a main body 16a and an upper top plate 16b serving as an electrode plate, and is supported on an upper portion of the processing chamber 1 via an insulating member 45. The main body 16a is formed of a conductive material, for example, aluminum having an anodically oxidized surface and is configured to support the upper top plate 16b to be detachably attached to a lower portion thereof. The upper top plate 16b is formed of a silicon-containing material, for example, quartz.

Gas diffusion spaces 16c and 16d are formed within the main body 16a, and multiple gas through holes 16e are formed in a bottom portion of the main body 16a to be located under the gas diffusion spaces 16c and 16d. The gas diffusion spaces are divided into the gas diffusion space 16c provided at a central portion and the gas diffusion space 16d provided at a peripheral portion, so that a supplying status of a processing gas can be independently changed at the central portion and the peripheral portion, respectively.

Further, gas discharge holes 16f penetrating through the upper top plate 16b in a thickness direction thereof are formed in the upper top plate 16b to be communicated with the gas through holes 16e. With this configuration, the processing gas supplied to the gas diffusion spaces 16c and 16d is dispersed in a shower shape and supplied into the processing chamber 1 through the gas through holes 16e and the gas discharge holes 16f. Furthermore, a non-illustrated heater or a temperature control unit such as a non-illustrated line for circulating a coolant is provided at the main body 16a, so that the shower head 16 can be controlled to have a desired temperature during a plasma etching process.

Two gas inlet openings 16g and 16h through which the processing gas is introduced into the gas diffusion spaces 16c and 16d are formed at the main body 16a. Gas supply lines 15a and 15b are respectively connected to the gas inlet openings 16g and 16h, and a processing gas supply source 15 configured to supply the processing gas for etching is connected to the other ends of the gas supply lines 15a and 15b. The processing gas supply source 15 is an example of a gas supply unit. A mass flow controller (MFC) 15c and an opening/closing valve V1 are sequentially provided from an upstream side at the gas supply line 15a. Further, a mass flow controller (MFC) 15d and an opening/closing valve V2 are sequentially provided from an upstream side at the gas supply line 15b.

A processing gas for plasma etching is supplied to the gas diffusion spaces 16c and 16d through the gas supply lines 15a and 15b from the processing gas supply source 15, and is dispersed in a shower shape and supplied into the processing chamber 1 through the gas through holes 16e and the gas discharge holes 16f from the gas diffusion spaces 16c and 16d. By way of example, a silicon-containing gas without oxygen used to form a silicon oxide film on a surface of a member provided within the processing chamber 1 is supplied from the processing gas supply source 15 as will be described later. By way of example, a processing gas including HBr/NF$_3$ used to perform a plasma process on the target object is supplied from the processing gas supply source 15. Further, a fluorine-containing gas used to remove the silicon oxide film from the member provided within the processing chamber 1 is supplied from the processing gas supply source 15. Details of the gases supplied from the processing gas supply source 15 will be described later.

A variable DC power supply 52 is electrically connected to the shower head 16 serving as the upper electrode via a low pass filter (LPF) 51. The variable DC power supply 52 is configured to turn on/off power supply by using an on/off switch 53. On/off operations of a current/voltage of the variable DC power supply 52 and the on/off switch 53 are controlled by a control unit 60 to be explained later. Further, as will be described later, when plasma is generated in the processing space by applying the high frequency powers from the first high frequency power supply 10a and the second high frequency power supply 10b to the mounting table 2, the on/off switch 53 can be turned on by the control unit 60 if necessary and a preset DC voltage is applied to the shower head 16 serving as the upper electrode.

An exhaust opening 71 is formed at a bottom portion of the processing chamber 1, and an exhaust device 73 is connected to the exhaust opening 71 via an exhaust pipe 72. The exhaust device 73 has a vacuum pump, and the inside of the processing chamber 1 can be depressurized to a preset vacuum level by operating the vacuum pump. The exhaust device 73 is an example of an exhaust unit. Meanwhile, a loading/unloading opening 74 for the semiconductor wafer W is formed at a side wall of the processing chamber 1, and a gate valve 75 configured to open and close the loading/unloading opening 74 is provided at the loading/unloading opening 74.

Reference numerals 76 and 77 denote deposit shields detachably attached. The deposit shield 76 is provided along an inner wall surface of the processing chamber 1, and is configured to suppress an etching by-product (deposit) from being attached to the processing chamber 1. Hereinafter, the inner wall of the processing chamber 1 and the deposit shield 76 may be referred to as "the inner wall of the processing chamber 1". Further, the deposit shield 77 is provided to cover outer peripheral surfaces of the mounting table 2 serving as the lower electrode, the inner wall member 3a, and the supporting member 4. Hereinafter, the mounting table 2, the inner wall member 3a, the supporting member 4, and the deposit shield 77 may be referred to as "the lower electrode". On the deposit shield 76, a conductive member (GND block) 79 grounded in a DC manner is provided at substantially the same height as that of the semiconductor wafer W, and is configured to suppress an abnormal discharge from being generated.

Further, ring magnets 80 are concentrically arranged around the processing chamber 1. The ring magnets 80 are configured to apply a magnetic field to a space between the shower head 16 and the mounting table 2. The ring magnets 80 are also configured to be rotatable by a non-illustrated rotation device.

An overall operation of the plasma etching apparatus configured as described above is controlled by the control unit 60. The control unit 60 includes a process controller 61 that includes a CPU and controls each part of the plasma etching apparatus, a user interface 62, and a storage unit 63.

The user interface 62 includes a keyboard by which a process manager inputs a command to manage the plasma etching apparatus, a display that visibly displays an operation status of the plasma etching apparatus, and the like.

The storage unit 63 stores a recipe of a control program (software) or processing condition data for enabling various processes executed in the plasma etching apparatus to be performed under the control of the process controller 61. Then, if necessary, a desired process is performed in the plasma etching apparatus under the control of the process controller 61 by retrieving a certain recipe from the storage unit 63 in response to an instruction or the like from the user interface 62 and executing the recipe in the process controller 61. Further, the recipe of the control program, the processing condition data, or the like may be stored in a computer-readable storage medium (for example, a hard disc, a CD, a flexible disc, a semiconductor memory, or the like), or may be transmitted at any time through, for example, a dedicated line from another device and used online.

By way of example, the control unit 60 controls each unit of the plasma processing apparatus to perform the plasma processing method to be described later. To be specific, the control unit 60 is configured to form a silicon oxide film on a surface of the member provided within the processing chamber 1 with plasma of a silicon-containing gas without oxygen while controlling a temperature of the member to be lower than a temperature of another member. Further, the control unit 60 performs a plasma process on the target object loaded into the processing chamber 1 with plasma of a processing gas after the silicon oxide film is formed. Then, the control unit 60 removes the silicon oxide film from the surface of the member with plasma of a fluorine-containing gas after the target object on which the plasma process is performed is unloaded to the outside of the processing chamber 1. Herein, the member provided within the processing chamber 1 includes, for example, the inner wall of the processing chamber 1, the mounting table 2 serving as the lower electrode, the inner wall member 3a, the supporting member 4, and the deposit shield 77, which are provided within the processing chamber 1. Hereinafter, the member provided within the processing chamber 1 may be referred to as "the in-chamber member". Further, the another member includes the shower head 16 serving as the upper electrode and facing the lower electrode within the processing chamber 1. Furthermore, the target object is, for example, the semiconductor wafer W.

Figure 2:
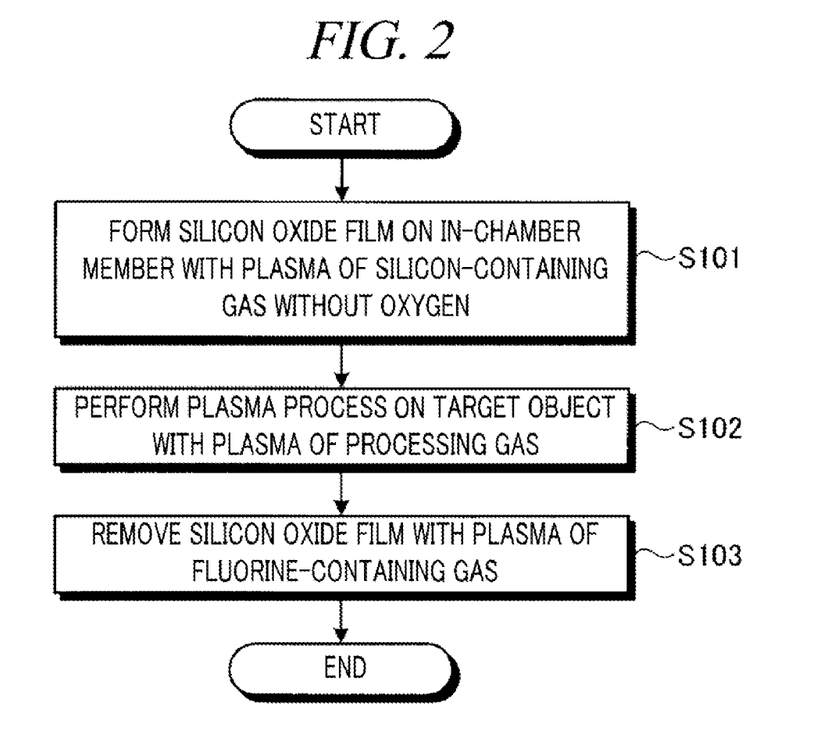
FIG. 2 is a flow chart showing a process flow example of the plasma processing method performed in the plasma processing apparatus in accordance with the present example embodiment.

Hereinafter, the plasma processing method performed in the plasma processing apparatus in accordance with the present example embodiment will be explained. FIG. 2 is a flow chart showing a process flow example of the plasma processing method performed in the plasma processing apparatus in accordance with the present example embodiment.

As depicted in FIG. 2, at block S101 (Form Silicon Oxide Film on In-Chamber Member with Plasma of Silicon-Containing Gas without Oxygen), the plasma processing apparatus performs a film forming process of forming a silicon oxide film on a surface of the in-chamber member with plasma of a silicon-containing gas without oxygen while controlling a temperature of the in-chamber member to be lower than a temperature of the another member. The in-chamber member includes, for example, the inner wall of the processing chamber 1, the mounting table 2 serving as the lower electrode, the inner wall member 3a, and the deposit shield 77, which are provided within the processing chamber 1. Further, the another member includes the shower head 16 serving as the upper electrode and facing the lower electrode within the processing chamber 1. Furthermore, the silicon-containing gas without oxygen includes at least one of, for example, $SiCl_4$ and $SiF_4$. Desirably, the silicon-containing gas without oxygen may further include a rare gas. The rare gas includes, for example, Ar or He.

Figure 3A:
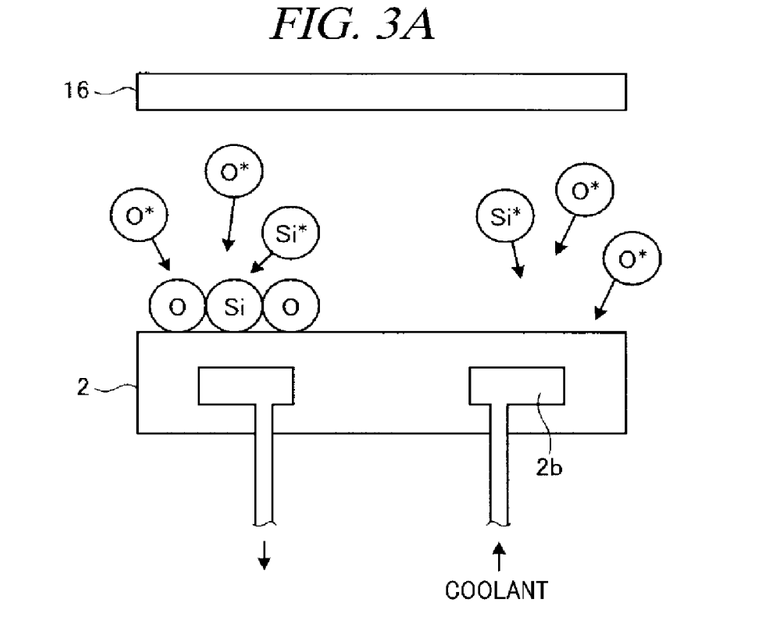
FIGS. 3A and 3B provide diagrams for explaining an example of a film forming process in accordance with the present example embodiment.
Figure 3B:
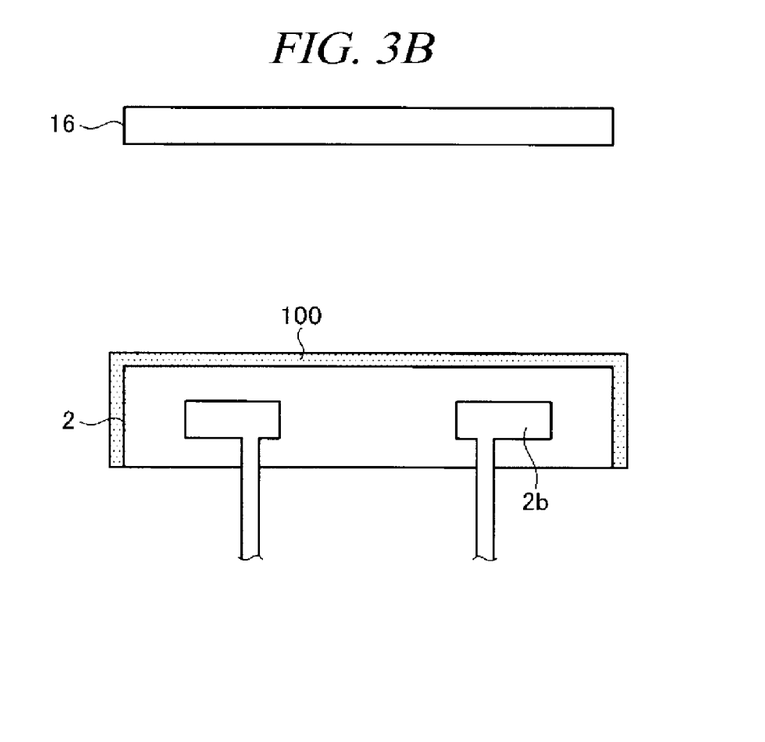

FIGS. 3A and 3B provide diagrams for explaining an example of the film forming process in accordance with the present example embodiment. FIGS. 3A and 3B illustrate an example where a silicon oxide film is formed on the mounting table 2 provided within the processing chamber 1. The control unit 60 of the plasma processing apparatus introduces a silicon-containing gas without oxygen into the inside of the processing chamber 1 from the processing gas supply source 15. Further, the control unit 60 applies the high frequency power for plasma generation to the inside of the processing chamber 1 from the first high frequency power supply 10a to generate plasma of the silicon-containing gas without oxygen. In this case, the control unit 60 does not apply the high frequency power for ion attraction from the second high frequency power supply 10b. That is, as depicted in FIG. 3A, the control unit 60 circulates the coolant through the coolant path 2b while generating plasma of the silicon-containing gas without oxygen, so that the mounting table 2 serving as the lower electrode is controlled to have a lower temperature than a temperature of the shower head 16. Then, the control unit 60 supplies, for example, $SiCl_4$/He as the silicon-containing gas without oxygen into the processing chamber 1.

As a result, as depicted in FIG. 3A, radicals in the plasma are attracted to the mounting table 2 having a relatively lower temperature, and react with one another on the mounting table 2. By way of example, in the example as depicted in FIG. 3A, Si radicals and oxygen radicals released from a member containing silicon oxide within the processing chamber 1 are attracted to the mounting table 2 having a temperature lower than that of the shower head 16, and a reaction between the Si radicals and the oxygen radicals is promoted on the mounting table 2. Then, as depicted in FIG. 3B, a silicon oxide film 100 is formed on the surface of the mounting table 2 serving as the lower electrode. The member containing silicon oxide within the processing chamber 1 includes, for example, the upper top plate 16b or the inner wall member 3a, which is made of quartz or the like. Thus, a reaction between the Si radicals and the oxygen radicals on the mounting table 2 within the processing chamber 1 can be promoted while a reaction between the Si radicals and the oxygen radicals in a space within the processing chamber 1 is suppressed. As a result, it is possible to control a thickness of a film on the member depending on a temperature of the member within the processing chamber 1. Further, since the film forming process is performed before performing a plasma process on the target object, it is possible to increase plasma resistance of the member within the processing chamber 1. Thus, it is possible to avoid consumption of the member or dispersion of contaminants from the member.

Although FIGS. 3A and 3B illustrate the example where a silicon oxide film is formed on the mounting table 2 serving as the lower electrode, a silicon oxide film may be formed on the supporting member 4 provided in the vicinity of the mounting table 2, the inner wall member 3a, or the deposit shield 77 in the same manner. That is, a silicon oxide film can be formed on the member provided within the processing chamber 1 and having a temperature lower than that of the shower head 16 serving as the upper electrode. Processing may proceed from block S101 to block S102.

Returning to FIG. 2, at block S102 (Perform Plasma Process on Target Object with Plasma of Processing Gas), the plasma processing apparatus performs a plasma process of performing the plasma process on the target object loaded into the processing chamber 1 with plasma of a processing gas. The target object is, for example, the semiconductor wafer W on which a silicon oxide film is deposited. Further, the processing gas is, for example, $HBr/NF_3$.

To be more specific, the control unit 60 of the plasma processing apparatus loads the target object into the processing chamber 1 through the loading/unloading opening 74 and the gate valve 75 and mounts the loaded target object on the electrostatic chuck 6. Then, the control unit 60 supplies the processing gas into the processing chamber 1 from the processing gas supply source 15; applies the high frequency power for plasma generation from the first high frequency power supply 10a; and applies the high frequency power for ion attraction from the second high frequency power supply 10b. As a result, the plasma process is performed on the target object. Processing may proceed from block S102 to block S103.

Further, at block S103 (Remove Silicon Oxide Film with Plasma of Fluorine-Containing Gas), the plasma processing apparatus performs a removal process of removing the silicon oxide film from the surface of the in-chamber member with plasma of a fluorine-containing gas after the target object is unloaded to the outside of the processing chamber 1. The fluorine-containing gas includes at least one of, for example, $NF_3$, $SF_6$, and $CF_4$.

To be more specific, the control unit 60 of the plasma processing apparatus unloads the target object to the outside of the processing chamber 1 through the loading/unloading opening 74 and the gate valve 75. Then, the control unit 60 supplies the fluorine-containing gas into the processing chamber 1 from the processing gas supply source 15 and applies the high frequency power for plasma generation from the first high frequency power supply 10a. In this case, the control unit 60 does not apply the high frequency power for ion attraction from the second high frequency power supply 10b. As a result, the silicon oxide is removed from the surface of the member within the processing chamber 1.

As described above, in accordance with the present example embodiment, before performing the plasma process on the target object, while the lower electrode provided within the processing chamber 1 is controlled to have a lower temperature than a temperature of the upper electrode, a silicon oxide film is formed on the surface of the lower electrode with plasma of the silicon-containing gas without oxygen. For this reason, in accordance with the present example embodiment, a reaction between Si radicals and oxygen radicals on the member within the processing chamber 1 can be promoted while a reaction between the Si radicals and the oxygen radicals in the space within the processing chamber 1 is suppressed. As a result, it is possible to improve controllability of a film thickness depending on a temperature of the member within the processing chamber 1 as compared with a method for forming a silicon oxide film by using a silicon-containing gas with oxygen. Further, since the film forming process is performed before performing the plasma process on the target object, it is possible to increase plasma resistance of the member within the processing chamber 1. Thus, it is possible to avoid consumption of the member or dispersion of contaminants from the member.

Further, in accordance with the present example embodiment, the silicon oxide film is removed from the surface of the lower electrode within the processing chamber 1 with plasma of the fluorine-containing gas after unloading the target object on which the plasma process is performed to the outside of the processing chamber 1. As a result, it is possible to clean the surface of the member within the processing chamber 1.

Furthermore, in accordance with the present example embodiment, the silicon-containing gas without oxygen includes at least one of, for example, $SiCl_4$ and $SiF_4$. As a result, it is possible to control a thickness of the film on the member depending on a temperature of the member within the processing chamber 1 with high accuracy.

Moreover, in accordance with the present example embodiment, the fluorine-containing gas includes at least one of, for example, $NF_3$, $SF_6$, and $CF_4$. As a result, it is possible to clean the surface of the member within the processing chamber 1 with more efficiency.

Besides, in accordance with the present example embodiment, the silicon-containing gas without oxygen further includes a rare gas. As a result, it is possible to control a thickness of the film on the member depending on a temperature of the member within the processing chamber 1 with higher accuracy.

Further, in accordance with the present example embodiment, the rare gas is Ar or He. As a result, it is possible to control a thickness of the film on the member depending on a temperature of the member within the processing chamber 1 with higher accuracy.

(Another Example Embodiment)

There have been explained the plasma processing method and the plasma processing apparatus in accordance with the present example embodiment, but example embodiments are not limited thereto. Hereinafter, another example embodiment will be explained.

(Bias Voltage)

By way of example, a bias voltage may be applied during a film forming process. That is, the control unit 60 supplies a silicon-containing gas without oxygen into the processing chamber 1 from the processing gas supply source 15 and applies the high frequency power for plasma generation into the processing chamber 1 from the first high frequency power supply 10*a* to generate plasma of the silicon-containing gas without oxygen. In this case, the control unit 60 applies the high frequency power for ion attraction to the mounting table 2 from the second high frequency power supply 10*b* to apply a bias voltage to the mounting table 2. Then, ions in the plasma are attracted to the mounting table 2. As a result, it is possible to control a thickness of a film on the member with higher accuracy as compared with a method in which a bias voltage is not applied.

Further, in the example embodiment, there has been explained the example where coolant is circulated through the coolant path 2*b*, so that the mounting table 2 serving as the lower electrode is controlled to have a lower temperature than a temperature of the shower head 16 serving as the upper electrode in the film forming process, but the present example embodiment is not limited thereto. By way of example, the shower head 16 serving as the upper electrode may be controlled to have a higher temperature than a temperature of the lower electrode or the inner wall of the processing chamber 1 in the film forming process. That is, a temperature of a member such as the lower electrode which serves as a film forming target needs to be relatively lower than a temperature of a member such as the upper electrode which does not serve as a film forming target. In this case, the control unit 60 includes a temperature control unit such as a heater to heat the shower head 16 serving as the upper electrode. Thus, the shower head 16 is controlled to have a higher temperature than a temperature of the mounting table 2. Then, the control unit 60 supplies, for example, $SiCl_4$/He as the silicon-containing gas without oxygen into the processing chamber 1. As a result, radicals in the plasma are attracted to the mounting table 2 having a relatively lower temperature and react with one another on the mounting table 2. Then, a silicon oxide film is formed on the surface of the mounting table 2 serving as the lower electrode. Thus, a reaction between Si radicals and oxygen radicals on the member within the processing chamber 1 can be promoted while a reaction between the Si radicals and the oxygen radicals in a space within the processing chamber 1 is suppressed. As a result, it is possible to improve controllability of a film thickness depending on a temperature of the member within the processing chamber 1 as compared with a method for forming a silicon oxide film by using a silicon-containing gas with oxygen

EXPERIMENTAL EXAMPLE

Hereinafter, the plasma processing method will be explained in more detail with reference to experimental examples. However, the plasma processing method is not limited to the experimental examples below.

Comparative Example 1

In a comparative example 1, a film forming process of forming a silicon oxide film on a surface of an in-chamber member, a plasma process of performing a plasma process on a target object, and a removal process of removing the silicon oxide film from the surface of the in-chamber member are performed in sequence. The film forming process, the plasma process, and the removal process are performed under the following conditions.

(Film Forming Process)
Processing gas: $SiCl_4$/He/$O_2$=25/100/250 sccm
Pressure: 1.3 Pa (10 mTorr)
Magnetic flux density: 454 G
High frequency power from first high frequency power supply: 500 W
High frequency power from second high frequency power supply: 0 W
Temperature (upper electrode/inner wall of processing chamber/lower electrode): 80/70/20° C.
Time: 60 seconds Further, in the film forming process, a thickness of the silicon oxide film formed on the surface of the lower electrode is measured. When the film thickness is measured, the silicon oxide film on the surface of the lower electrode is not directly measured, but a Si substrate is provided on the electrostatic chuck 6 of the mounting table 2 and then, a thickness of a silicon oxide film formed on the Si substrate is measured as the thickness of the silicon oxide film on the surface of the lower electrode.

(Plasma Process)
Processing gas: $HBr/NF_3=350/100$ sccm
Pressure: 13 Pa (100 mTorr)
Magnetic flux density: 454 G
High frequency power from first high frequency power supply: 900 W
High frequency power from second high frequency power supply: 1200 W
Temperature (upper electrode/inner wall of processing chamber/lower electrode): 80/70/40° C.
Time: 60 seconds
(Removal Process)
Processing gas: $NF_3=300$ sccm
Pressure: 27 Pa (200 mTorr)
Magnetic flux density: 454 G
High frequency power from first high frequency power supply: 750 W
High frequency power from second high frequency power supply: 0 W
Temperature (upper electrode/inner wall of processing chamber/lower electrode): 80/70/40° C.
Time: 120 seconds Comparative Example 2

In a comparative example 2, the film forming process is performed under the following temperature condition. The other conditions are the same as those of the comparative example 1.
Temperature (upper electrode/inner wall of processing chamber/lower electrode): 80/70/40° C.

Comparative Example 3

In a comparative example 3, the film forming process is performed under the following temperature condition. The other conditions are the same as those of the comparative example 1.
Temperature (upper electrode/inner wall of processing chamber/lower electrode): 80/70/60° C.

Experimental Example 1

In an experimental example 1, a film forming process of forming a silicon oxide film on a surface of an in-chamber member, a plasma process of performing a plasma process on a target object, and a removal process of removing the silicon oxide film from the surface of the in-chamber member are performed in sequence. The plasma process and the removal process are performed under the same conditions as those of the comparative example 1. The film forming process is performed under the following conditions.
(Film Forming Process)
Processing gas: $SiCl_4/He=25/100$ sccm
Pressure: 1.3 Pa (10 mTorr)
Magnetic flux density: 454 G
High frequency power from first high frequency power supply: 500 W
High frequency power from second high frequency power supply: 0 W
Temperature (upper electrode/inner wall of processing chamber/lower electrode): 80/70/20° C.
Time: 60 seconds Further, in the film forming process, a thickness of the silicon oxide film formed on the surface of the lower electrode is measured. When the film thickness is measured, the silicon oxide film on the surface of the lower electrode is not directly measured but a Si substrate is provided on the electrostatic chuck 6 of the mounting table 2 and a thickness of a silicon oxide film formed on the Si substrate is measured as the thickness of the silicon oxide film on the surface of the lower electrode.

Experimental Example 2

In an experimental example 2, the film forming process is performed under the following temperature condition. The other conditions are the same as those of the experimental example 1.
Temperature (upper electrode/inner wall of processing chamber/lower electrode): 80/70/40° C.

Experimental Example 3

In an experimental example 3, the film forming process is performed under the following temperature condition. The other conditions are the same as those of the experimental example 1.
Temperature (upper electrode/inner wall of processing chamber/lower electrode): 80/70/60° C.

Figure 4:
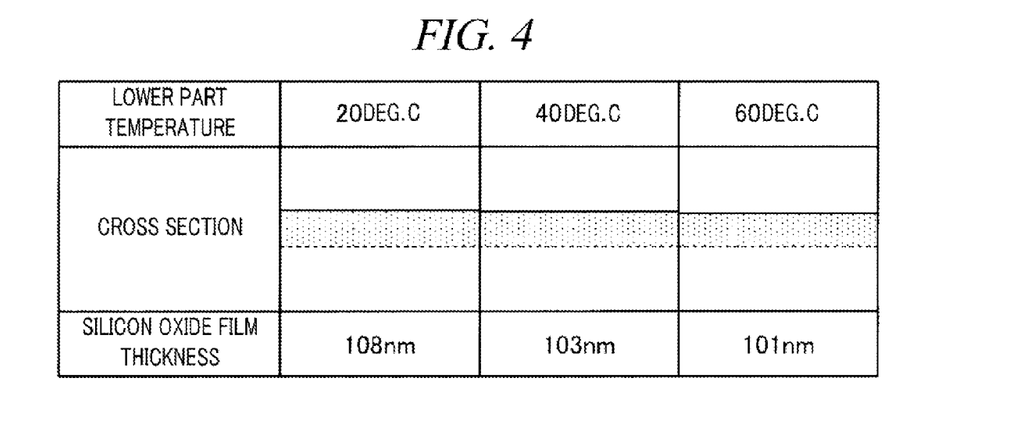
FIG. 4 provides processing results of comparative examples 1 to 3.
Figure 5:
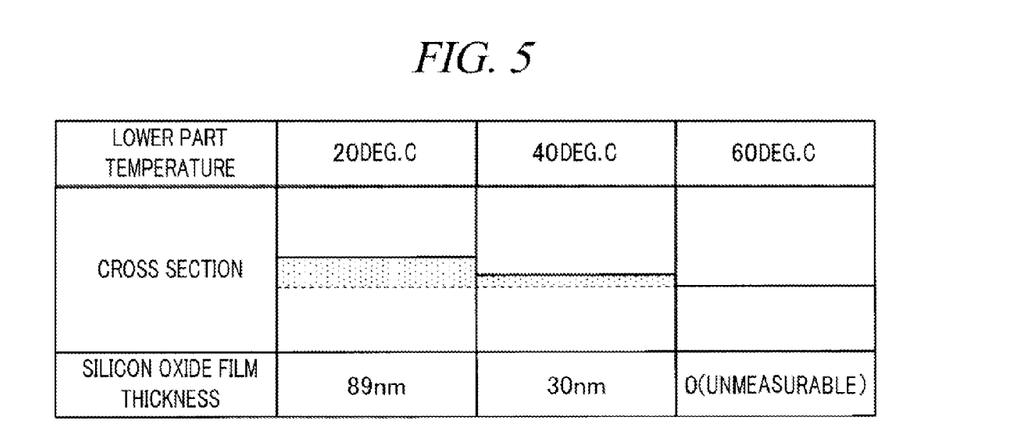
FIG. 5 provides processing results of experimental examples 1 to 3.

FIG. 4 provides processing results of the comparative examples 1 to 3. FIG. 5 provides processing results of the experimental examples 1 to 3. In FIG. 4 and FIG. 5, "lower part temperature: 20 deg. C." represents a Si substrate after a film forming process of forming a silicon oxide film on the lower electrode of about 20° C. "Lower part temperature: 40 deg. C." represents a Si substrate after a film forming process of forming a silicon oxide film on the lower electrode of about 40° C. "Lower part temperature: 60 deg. C" represents a Si substrate after a film forming process of forming a silicon oxide film on the lower electrode of about 60° C.

Further, in FIG. 4 and FIG. 5, "cross section" shows traced drawings of photos obtained by enlarging cross sections of the Si substrates. Furthermore, in FIG. 4 and FIG. 5, thicknesses of silicon oxide films formed on the Si substrates are provided together.

As shown in FIG. 4, in the comparative examples 1 to 3 in which $SiCl_4/He/O_2$ is used, thicknesses of the silicon oxide films formed on the Si substrates are nearly uniform regardless of a temperature of the lower electrode. However, as shown in FIG. 5, in the experimental examples 1 to 3 in which $SiCl_4/He$ is used, thicknesses of the silicon oxide films formed on the Si substrates are increased as a temperature of the lower electrode is decreased. In other words, in the experimental examples 1 to 3 in which $SiCl_4/He$ is used, thicknesses of the silicon oxide films formed on the Si substrates are increased as a temperature of the lower electrode is controlled to be relatively lower than a fixed temperature of the upper electrode.

As can be seen from the comparison between the comparative examples 1 to 3 and the experimental examples 1 to 3, in the experimental examples 1 to 3, the silicon oxide films are formed by using a silicon-containing gas without oxygen. Therefore, it is possible to improve controllability of a thickness of a film on the member depending on a temperature as compared with a method of forming a silicon oxide film by using a silicon-containing gas with oxygen.

Comparative Example 4

In a comparative example 4, a film forming process is performed under the following temperature condition. The other conditions are the same as those of the comparative example 1.
Temperature (upper electrode/inner wall of processing chamber/lower electrode): 60/70/20° C.

Comparative Example 5

In a comparative example 5, a film forming process is performed under the following temperature condition. The other conditions are the same as those of the comparative example 1.
Temperature (upper electrode/inner wall of processing chamber/lower electrode): 40/70/20° C.

Experimental Example 4

In an experimental example 4, a film forming process is performed under the following temperature condition. The other conditions are the same as those of the experimental example 1.
Temperature (upper electrode/inner wall of processing chamber/lower electrode): 60/70/20° C.

Experimental Example 5

In an experimental example 5, a film forming process is performed under the following temperature condition. The other conditions are the same as those of the experimental example 1.
Temperature (upper electrode/inner wall of processing chamber/lower electrode): 40/70/20° C.

Figure 6:
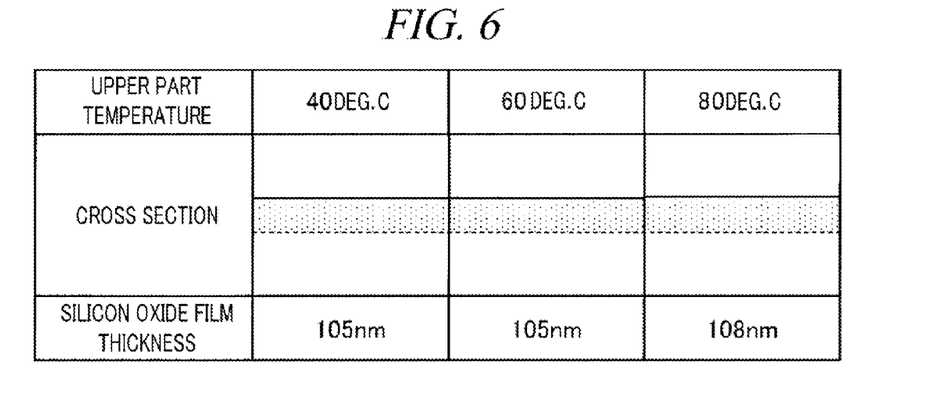
FIG. 6 provides processing results of comparative examples 1, 4, and 5.
Figure 7:
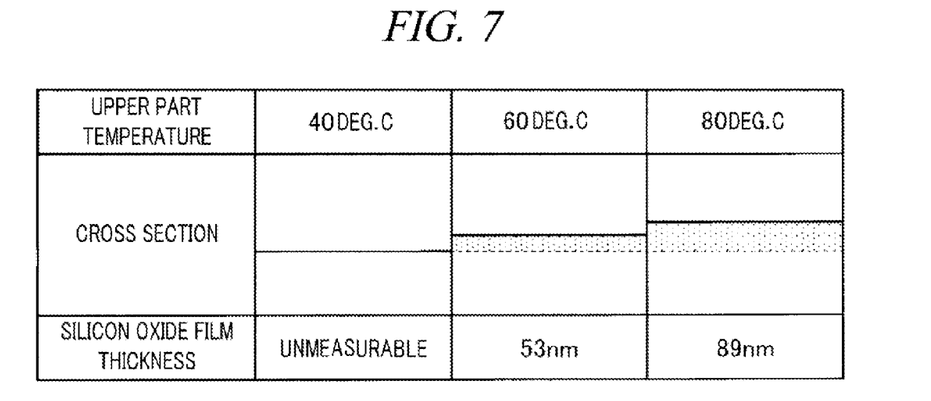
FIG. 7 provides processing results of experimental examples 1, 4, and 5.

FIG. 6 provides processing results of the comparative examples 1, 4, and 5. FIG. 7 provides processing results of the experimental examples 1, 4, and 5. In FIG. 6 and FIG. 7, "upper part temperature: 40 deg. C." represents a Si substrate after a film forming process of forming a silicon oxide film on the upper electrode of about 40° C. "Upper part temperature: 60 deg. C." represents a Si substrate after a film forming process of forming a silicon oxide film on the upper electrode of about 60° C. "Upper part temperature: 80 deg. C." represents a Si substrate after a film forming process of forming a silicon oxide film on the upper electrode of about 80° C.

Further, in FIG. 6 and FIG. 7, "cross section" shows traced drawings of photos obtained by enlarging cross sections of the Si substrates. Furthermore, in FIG. 6 and FIG. 7, thicknesses of silicon oxide films formed on the Si substrates are provided together.

As shown in FIG. 6, in the comparative examples 1, 4, and 5 in which $SiCl_4/He/O_2$ is used, thicknesses of the silicon oxide films formed on the Si substrates are nearly uniform regardless of a temperature of the upper electrode. However, as shown in FIG. 7, in the experimental examples 1, 4, and 5 in which $SiCl_4/He$ is used, thicknesses of the silicon oxide films formed on the Si substrates are increased as a temperature of the upper electrode is increased. In other words, in the experimental examples 1, 4, and 5 in which $SiCl_4/He$ is used, thicknesses of the silicon oxide films formed on the Si substrates are increased as a temperature of the upper electrode is controlled to be relatively higher than a fixed temperature of the lower electrode.

As can be seen from the comparison between the comparative examples 1, 4, and 5 and the experimental examples 1, 4, and 5, in the experimental examples 1, 4, and 5, the silicon oxide films are formed by using a silicon-containing gas without oxygen. Therefore, it is possible to improve controllability of a thickness of a film on the member depending on a temperature as compared with a method of forming a silicon oxide film by using a silicon-containing gas with oxygen.

Comparative Example 6

In a comparative example 6, a film forming process is performed under the following high frequency power conditions. The other conditions are the same as those of the comparative example 1.
High frequency power from first high frequency power supply: 500 W
High frequency power from second high frequency power supply: 500 W Comparative Example 7

In a comparative example 7, a film forming process is performed under the following high frequency power conditions. The other conditions are the same as those of the comparative example 1.
High frequency power from first high frequency power supply: 500 W
High frequency power from second high frequency power supply: 1000 W Experimental Example 6

In an experimental example 6, a film forming process is performed under the following high frequency power conditions. The other conditions are the same as those of the experimental example 1.
High frequency power from first high frequency power supply: 500 W
High frequency power from second high frequency power supply: 500 W Experimental Example 7

Figure 8:
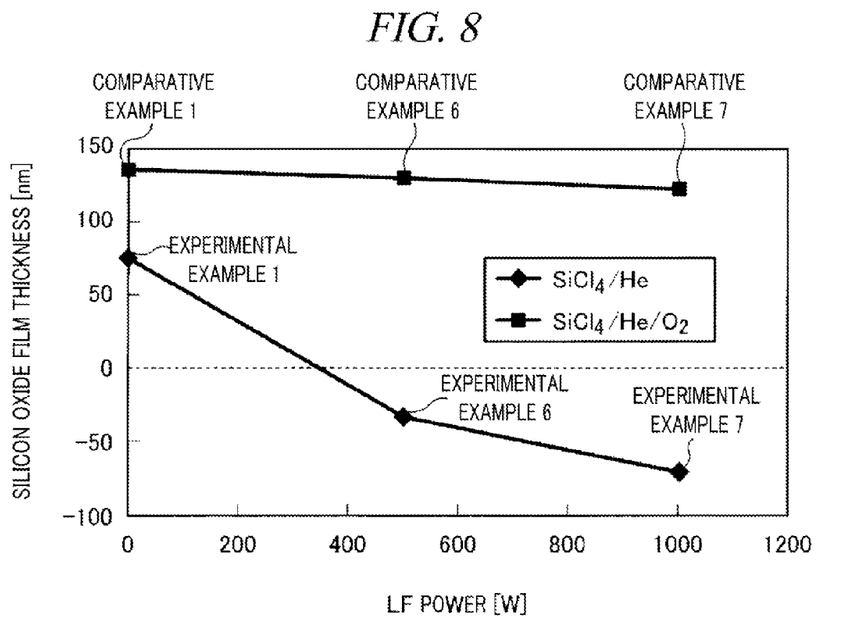
FIG. 8 provides processing results of comparative examples 1, 6, and 7 and experimental examples 1, 6, and 7.

In experimental example 7, a film forming process is performed under the following high frequency power conditions. The other conditions are the same as those of the experimental example 1.
High frequency power from first high frequency power supply: 500 W
High frequency power from second high frequency power supply: 1000 W FIG. 8 provides processing results of the comparative examples 1, 6, and 7 and the experimental examples 1, 6, and 7. In FIG. 8, a horizontal axis represents a high frequency power (W) from the second high frequency power supply, and a longitudinal axis represents a thickness (nm) of a silicon oxide film formed on a Si substrate.

As shown in FIG. 8, in the comparative examples 1, 6, and 7 in which $SiCl_4/He/O_2$ is used, thicknesses of the silicon oxide films formed on the Si substrates are nearly uniform regardless of a high frequency power, i.e. a bias voltage, from the second high frequency power supply. However, in the experimental examples 1, 6, and 7 in which $SiCl_4/He$ is used, thicknesses of the silicon oxide films formed on the Si substrates are decreased as a bias voltage is increased.

As can be seen from the comparison between the comparative examples 1, 6, and 7 and the experimental examples 1, 6, and 7, in the experimental examples 1, 6, and 7, the silicon oxide films are formed while applying a bias voltage. Therefore, it is possible to control a thickness of a film on the member with higher accuracy as compared with a method in which a bias voltage is not applied. It may be because in the experimental examples where a silicon oxide film is formed by using a silicon-containing gas without oxygen, when Si radicals and oxygen radicals react with each other on the member within the processing chamber 1, ions (for example, He ions) collide with a reaction product having a relatively lower sputtering resistance to suppress a silicon oxide film from being formed. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing method comprising:
    forming a silicon oxide film on a surface of a member provided within a chamber with plasma generated from a silicon-containing gas devoid of oxygen, while controlling a temperature of the member to be lower than a temperature of another member;
    performing a plasma process on a target object loaded into the chamber with plasma of a processing gas after the silicon oxide film is formed on the surface of the member; and
    removing the silicon oxide film from the surface of the member with plasma generated from a fluorine-containing gas after the target object on which the plasma process is performed is unloaded to an outside of the chamber,
    wherein the member and the another member include at least one of an inner wall of the chamber or a component provided within the chamber.

2. The plasma processing method of claim 1,
    wherein the member includes the inner wall of the chamber and a lower electrode provided within the chamber,
    the another member includes an upper electrode provided within the chamber to face the lower electrode, and
    in the forming of the silicon oxide film, the silicon oxide film is formed on surfaces of the inner wall of the chamber and the lower electrode while controlling temperatures of the inner wall of the chamber and the lower electrode to be lower than a temperature of the upper electrode.

3. The plasma processing method of claim 1,
    wherein in the forming of the silicon oxide film, a bias voltage is applied.

4. The plasma processing method of claim 1,
    wherein the silicon-containing gas includes at least one of $SiCl_4$ and $SiF_4$.

5. The plasma processing method of claim 1,
    wherein the fluorine-containing gas includes at least one of $NF_3$, $SF_6$, and $CF_4$.

6. The plasma processing method of claim 1,
    wherein the silicon-containing gas further includes a rare gas.

7. The plasma processing method of claim 6,
    wherein the rare gas is Ar or He.

* * * * *